United States Patent
Kim et al.

(10) Patent No.: US 9,118,856 B2
(45) Date of Patent: Aug. 25, 2015

(54) SENSOR, DATA PROCESSING SYSTEM, AND OPERATING METHOD

(75) Inventors: Won Joo Kim, Hwaseong-si (KR); Hyoung Soo Ko, Hwaseong-si (KR); Doo Cheol Park, Hwaseong-si (KR); Hee Woo Park, Seoul (KR); Kwang-Min Lee, Anyang-si (KR); Ju Hwan Jung, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 535 days.

(21) Appl. No.: 13/541,973

(22) Filed: Jul. 5, 2012

(65) Prior Publication Data
US 2013/0010072 A1   Jan. 10, 2013

(30) Foreign Application Priority Data
Jul. 8, 2011 (KR) .................. 10-2011-0068071

(51) Int. Cl.
| H04N 15/00 | (2006.01) |
| H01L 27/146 | (2006.01) |
| H04N 5/369 | (2011.01) |
| H04N 13/02 | (2006.01) |

(52) U.S. Cl.
CPC ........ *H04N 5/3696* (2013.01); *H01L 27/14609* (2013.01)

(58) Field of Classification Search
CPC .......... H04N 13/0239; H04N 13/0055; H04N 13/0296; H04N 13/0497; H04N 13/0242; H04N 5/335; H04N 5/378; H04N 3/155; H04N 9/045; H04N 3/1512; H01L 27/14643

USPC ........................................... 348/46
See application file for complete search history.

(56) References Cited

U.S. PATENT DOCUMENTS

| 6,512,838 | B1* | 1/2003 | Rafii et al. ................. 382/106 |
| 8,786,682 | B2* | 7/2014 | Shpunt et al. ................. 348/50 |
| 2010/0020209 | A1* | 1/2010 | Kim ............................ 348/294 |
| 2010/0033611 | A1* | 2/2010 | Lee et al. ..................... 348/302 |
| 2010/0059844 | A1* | 3/2010 | Tanaka ......................... 257/432 |
| 2010/0073462 | A1* | 3/2010 | Lee et al. ........................ 348/46 |
| 2011/0285910 | A1* | 11/2011 | Bamji et al. ................. 348/631 |
| 2011/0292181 | A1* | 12/2011 | Acharya et al. ............... 348/47 |
| 2012/0154535 | A1* | 6/2012 | Yahav et al. ................... 348/46 |
| 2012/0224028 | A1* | 9/2012 | Park et al. ...................... 348/46 |
| 2013/0010072 | A1* | 1/2013 | Kim et al. ...................... 348/46 |
| 2013/0229491 | A1* | 9/2013 | Kim et al. ...................... 348/46 |
| 2014/0192160 | A1* | 7/2014 | Chang et al. ................... 348/46 |

FOREIGN PATENT DOCUMENTS

| JP | 2008177738 | 7/2008 |
| KR | 20100011676 | 2/2010 |
| KR | 20100018449 | 2/2010 |
| KR | 20100034996 | 4/2010 |

* cited by examiner

*Primary Examiner* — Sath V Perungavoor
*Assistant Examiner* — Howard D Brown, Jr.
(74) *Attorney, Agent, or Firm* — Volentine & Whitt, PLLC

(57) ABSTRACT

An image sensor includes a unit pixel including a plurality of color pixels with a depth pixel. A first signal line group of first signal lines is used to supply first control signals that control operation of the plurality of color pixels, and a separate second signal line group of second signal lines is used to supply second control signals that control operation of the depth pixel.

17 Claims, 13 Drawing Sheets

| G | R |
|---|---|
| B | Z |

| B | G | B | G |
|---|---|---|---|
| G | Z |   | R |
| B |   |   | G |
| G | R | G | R |

SENSOR, DATA PROCESSING SYSTEM, AND OPERATING METHOD

CROSS-REFERENCE TO RELATED APPLICATIONS

This application claims priority under 35 U.S.C. §119(a) from Korean Patent Application No. 10-2011-0068071 filed on Jul. 8, 2011, the subject matter of which is hereby incorporated by reference.

BACKGROUND OF THE INVENTION

The inventive concept relates to sensors, such as image sensors, and data processing systems including same. More particularly, the inventive concept relates to image sensors that are capable of determining both color and depth information related to an imaged object, as well as data processing systems including such image sensors and operating methods for such data processing systems.

So-called three-dimensional (3D) image sensors are variously capable of determining color information and or depth information for an imaged object. Color information has been acquired by an image sensor including a plurality of color pixels, while depth information has been acquired by an image sensor including a plurality of depth pixels.

SUMMARY OF THE INVENTION

One embodiment of the inventive concept is directed to a sensor including; a pixel array including a unit pixel including a plurality of color pixels with a depth pixel, a first signal line group of first signal lines that supply first control signals controlling operation of the plurality of color pixels, and a second signal line group of second signal lines that supply second control signals controlling operation of the depth pixel.

Another embodiment of the inventive concept is directed to a data processing system including; an image sensor and a processor that controls operation of the image sensor. The image sensor includes; a pixel array including a unit pixel including a plurality of color pixels with a depth pixel, a first signal line group of first signal lines that supply first control signals controlling operation of the plurality of color pixels, and a second signal line group of second signal lines that supply second control signals controlling operation of the depth pixel.

Another embodiment of the inventive concept is directed to a mobile communication device including; an image sensor and a processor that controls operation of the image sensor, wherein the image sensor generates a signal output and comprises a pixel array including a unit pixel including a plurality of color pixels with a depth pixel, a first signal line group of first signal lines that supply first control signals controlling operation of the plurality of color pixels, and a second signal line group of second signal lines that supply second control signals controlling operation of the depth pixel, and an image signal processor that processes the signal output to display a processed signal via a display.

Another embodiment of the inventive concept is directed to a method for operating an image sensor including a pixel array having a unit pixel including a plurality of color pixels with a depth pixel. The method includes; applying first control signals through a first row driver and first signal lines to control operation of the plurality of color pixels, and applying second control signals through a second row driver and second signal lines to control the depth pixel.

BRIEF DESCRIPTION OF THE DRAWINGS

These and/or other aspects and advantages of the inventive concept will become apparent and more readily appreciated from the following description of the embodiments taken in conjunction with the accompanying drawings of which:

FIG. 6 is a conceptual illustration of a unit pixel that may be included in the pixel array of FIG. 1;

FIG. 9 is a conceptual illustration of another unit pixel that may be included in the pixel array of FIG. 1;

DETAILED DESCRIPTION

Certain embodiments of the inventive concept will now be described in some additional detail with reference to the accompanying drawings. The inventive concept may, however, be embodied in many different forms and should not be construed as being limited to only the illustrated embodiments. Rather, the illustrated embodiments are provided so that this disclosure will be thorough and complete, and will fully convey the scope of the inventive concept to those skilled in the art. Throughout the written description and drawings, like reference numbers and labels are used to denote like or similar elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which the inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
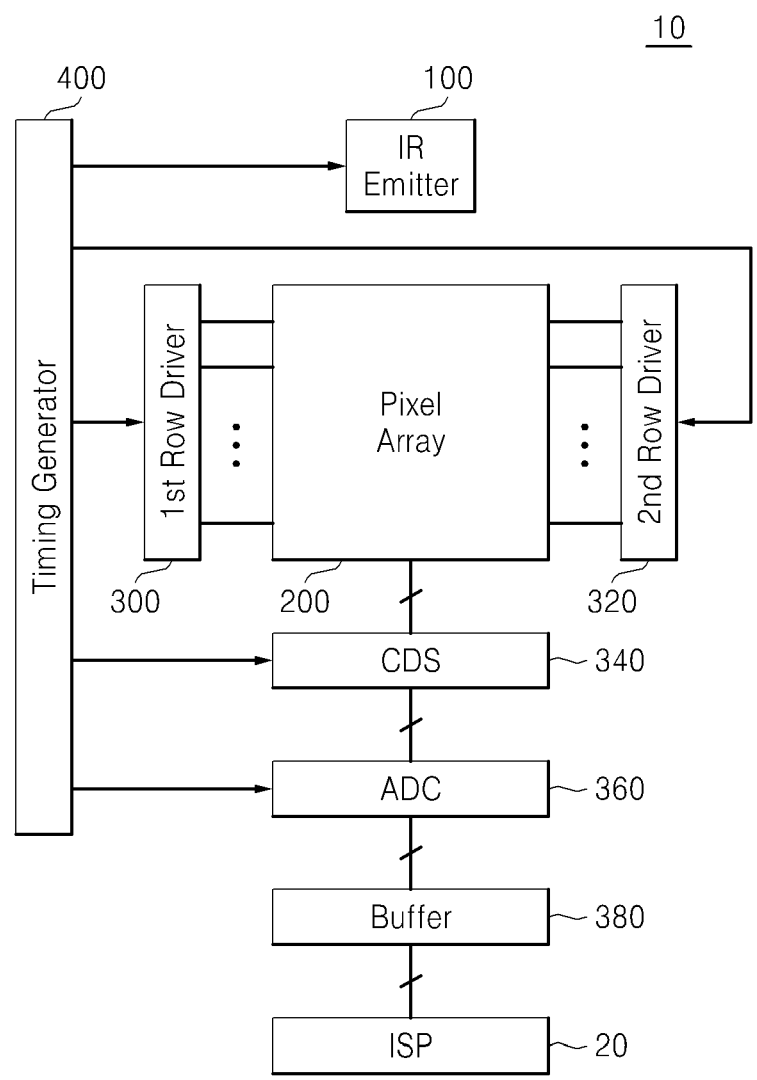
FIG. 1 is a block diagram of an image sensor according to an embodiment of the inventive concept.

Figure (FIG.) 1 is a block diagram of an image sensor according to an embodiment of the inventive concept. The term "image sensor" is used in this description to denote a sensor capable of obtaining color information and/or depth information from an imaged object. Referring to FIG. 1, an image sensor 10 may be a three-dimensional (3D) image sensor capable of obtaining "3D image information" that combines color information using a plurality of color pixels and depth information using a plurality of depth pixels. Color information may include, for example, red color information, green color information and/or blue color information. That is, each one of the plurality of color pixels may be a red pixel, a green pixel, and/or a blue pixel.

The image sensor 10 of FIG. 1 may obtain (or determine) color information by converting light incident received by the plurality of color pixels (hereafter, "incident light") into a corresponding electrical signal. For example, the image sensor 10 may emit an infrared photon (or optical) signal (e.g., a modulated infrared photon (or optical) signal) using an infrared light source 100 in order to illuminate an imaged object. In this manner, image sensor 10 may determine the distance or depth to the imaged object using a time difference between emission of the infrared photon signal by the infrared light source 100 and return of incident light resulting from the infrared photon signal (hereafter, the "reflected photon signal") to the image sensor 10 by the imaged object.

The image sensor 10 of FIG. 1 comprises in addition to the infrared light source 100, a pixel array 200, a first row driver 300, a second row driver 320, a timing generator 400, a correlated double sampling (CDS) block 340, an analog to digital converter (ADC) 360 and a buffer 380. Optionally, the image sensor 10 may further comprise an image signal processor (ISP) 20.

In certain embodiments, the image sensor 10 and ISP 20 may be commonly embodied on a single semiconductor chip (e.g., a System on Chip (SoC)) or separately embodied on different semiconductor chips.

The image sensor 10 may further include a column decoder (not shown) that communicate data received from the buffer 380 to the ISP 20 under the control of the timing generator 400.

The infrared light source 100 may be used to illuminate an imaged object using an infrared photon signal and under the control of the timing generator 400. The infrared light source 100 may be a light emitting diode (LED), an organic light emitting diode (OLED), an active-matrix organic light emitting diode (AMOLED), and/or a laser diode.

The pixel array 200 may include a plurality of pixels that are two-dimensionally embodied and include a plurality of color pixels and a plurality of depth pixels. The plurality of color pixels may include red pixels converting incident light in a defined red spectrum region into a corresponding electrical signal, green pixels converting incident light in a defined green spectrum region into a corresponding electrical signal, and blue pixels converting incident light in a defined blue spectrum region into a corresponding electrical signal.

Additionally, one or more lens (not shown) for concentrating the incident light and color filter(s) (not shown) for transmitting a particular portion of the overall light spectrum may be arranged over or on each one of the plurality of color pixels. For example, a red filter (not shown) passing incident light in the red spectrum region may be arranged over each red pixel, a green filter (not shown) passing incident light in the green spectrum region may be arranged over each green pixel, and a blue filter (not shown) passing incident light in the blue spectrum region may be arranged over each blue pixel.

Each of the plurality of depth pixels may generate a plurality of frame signals in response to the reflected photon signal and a plurality of control signals. The plurality of control signals may be provided by the second row driver 320. In addition, there may be one or more lens (not shown) concentrating the reflected photon signal and/or one or more infrared pass filter (not shown) passing the concentrated photon signal on each one of the plurality of depth pixels.

The first row driver 300 may be used to supply a plurality of first control signals controlling the operation of the plurality of color pixels to each of the plurality of color pixels under the control of the timing generator 400. That is, the first row driver 300 may be used to drive the plurality of color pixels on a row by row basis.

The second row driver 320 may be used to supply a plurality of second control signals controlling operation of the plurality of depth pixels to each of the plurality of depth pixels under the control of the timing generator 400. That is, the second row driver 320 may drive the plurality of depth pixels on a row by row basis. However, in certain embodiments, the first row driver 300 and second row driver 320 may be embodied in a single row driver.

The CDS block 340 may be used to perform correlated double sampling (CSD) on the output signals provided by the pixel array 200 in response to control signals provided by the timing generator 400. The ADC 360 may then perform analog-to-digital conversion on the correlated double sampled signals provided by the CDS block 340 in order to provide output digital signal(s). In certain embodiments, the ADC 360 may include a plurality of comparators (not shown) and a plurality of counters (not shown).

The buffer 380 may be used to receive and store the digital signal(s) provide by the ADC 360. The digital signal(s) stored in the buffer 380 may then be output to the ISP 20 by a column decoder (not shown).

The timing generator 400 may be used to generate various control signals that control the respective operation of (and inter-operation between) the components of the image sensor 10, including but not limited to, the infrared light source 100, the first row driver 300, the second row driver 320, the CDS block 340 and the ADC 360.

Figure 2:
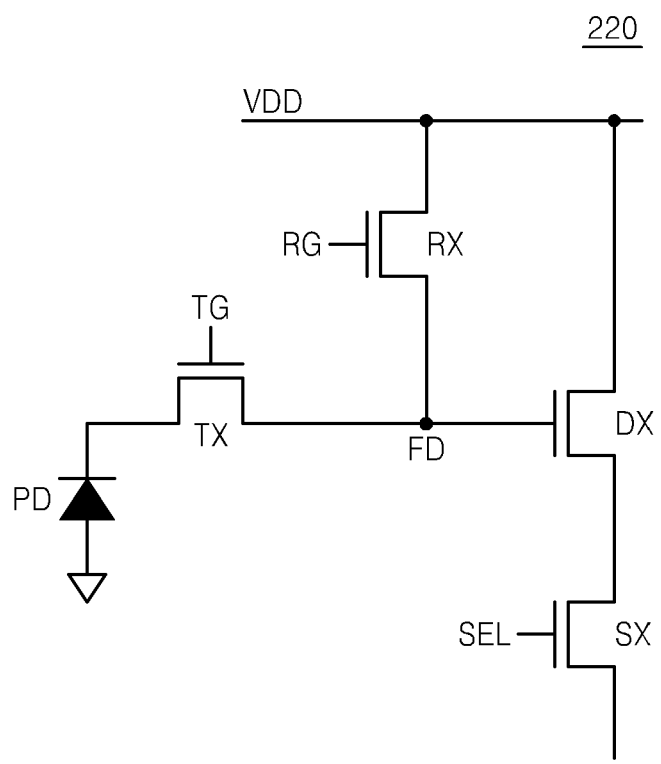
FIG. 2 is a circuit diagram illustrating a color pixel that may be included in the pixel array of FIG. 1.

FIG. 2 is a circuit diagram of a color pixel 220 that may be included in the pixel array 200 of FIG. 1. Referring to FIGS. 1 and 2, the color pixel 220 includes a photo-electric conversion element PD, a transmission transistor TX, a reset transistor RX, a drive transistor DX and a select transistor SX.

The photo-electric conversion element PD generates photo-generated charges corresponding to an incident light incident to the color pixel 220. The photo-electric conversion element PD may be embodied in a photo diode, photo transistor or a pinned photo diode. The color pixel 220 may be a red pixel, a greed pixel or a blue pixel.

The transmission transistor TX transmits the photo-generated charges accumulated on the photo-electric conversion element PD to a floating diffusion region FD in response to a transmission control signal TG The photo-generated charges transmitted by a turn-on operation of the transmission transistor TX are stored in the floating diffusion region FD. The reset transistor RX may reset a voltage level of the floating diffusion region FD to a supply voltage level VDD in response to a reset signal RG output from the first row driver 300.

The drive transistor DX, which may perform a role of a source follower buffer amplifier, outputs, in response to photo-generated charges transmitted from the floating diffusion region FD, an electrical signal proportioned to an amount of the photo-generated charges. The select transistor SX outputs an output signal of the drive transistor DX to the CDS block 340 in response to a select signal SEL output from the first row driver 300. The transmission control signal TG, a reset signal RG and a select signal SEL are generated by the first row driver 300.

Each of the transmission transistor TX, the reset transistor RX, the drive transistor DX and the select transistor SX illustrated in FIG. 2 may be embodied by a NMOS transistor. However, each of the transmission transistor TX, the reset transistor RX, the drive transistor DX and the select transistor SX may alternately be embodied by a PMOS transistor in certain embodiments.

The color pixel 220 of FIG. 2 includes four transistors. However, embodiments of the inventive concept are not restricted to only four transistor circuits, and those skilled in the art will recognize that the number of transistors used to embody the color pixel 220 may vary by application.

Figure 3:
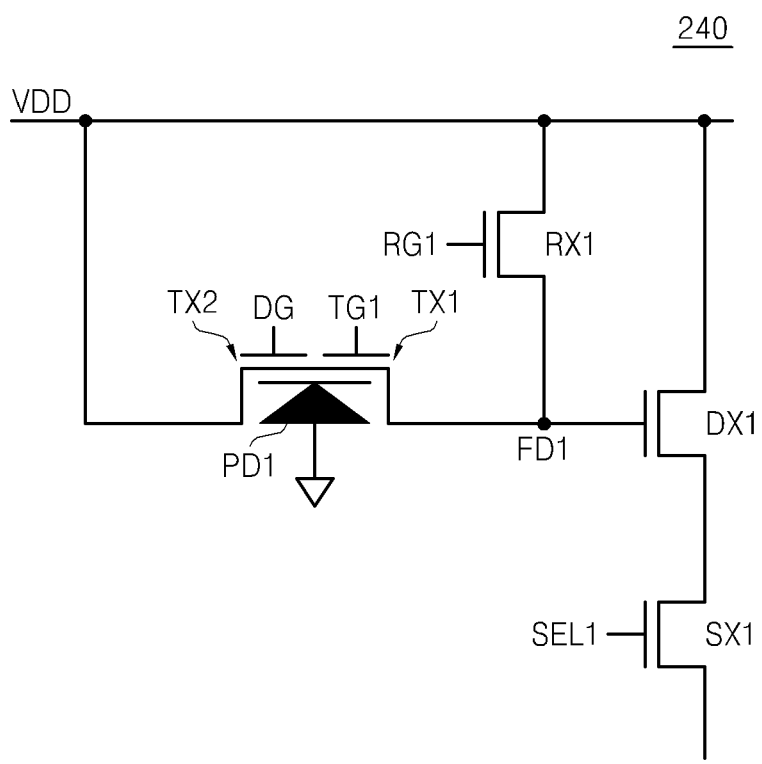
FIG. 3 is a circuit diagram illustrating a depth pixel that may be included in the pixel array of FIG. 1.

FIG. 3 is a circuit diagram of a depth pixel 240 that may be included in the pixel array 200 of FIG. 1. Referring to FIGS. 1 and 3, the depth pixel 240 includes a photo-electric conversion element PD1, a transmission transistor TX1, an overflow transistor TX2, a reset transistor RX1, a drive transistor DX1 and a select transistor SX1.

The photo-electric conversion element PD1 generates photo-generated charges corresponding to an incident light incident to the depth pixel 240. The photo-electric conversion element PD1 may be embodied in a photo diode or a pinned photo diode.

The transmission transistor TX1 transmits the photo-generated charges accumulated on the photo-electric conversion element PD1 to the floating diffusion region FD1 in response to a first transmission control signal TG1. The photo-generated charges transmitted by a turn-on operation of the transmission transistor TX1 are stored in the floating diffusion region FD1. The first transmission control signal TG1 each having a phase difference of 0°, 90°, 180° or 270° from an infrared photon signal is successively supplied to a gate of the transmission transistor TX1.

The overflow transistor TX2 supplies a discharge path through which photo-generated charges generated by the photo-electric conversion element PD1 are discharged to a power supply terminal supplying a supply voltage VDD in response to a second transmission control signal DG That is, a drain terminal of the over flow transistor TX2 is connected to the power supply terminal. A second transmission control signal DG which has a phase difference of 180° from the first transmission control signal TG1 input to a gate of the transmission transistor TX1 is supplied to a gate of the overflow transistor TX2.

The image sensor 10 may determine (or estimate) depth information between the image sensor to an imaged object based on photo-generated charges transmitted to the floating diffusion region FD1. Accordingly, the depth pixel 240 illustrated in FIG. 3 may be understood as a one-tap structure.

The reset transistor RX1 may reset a voltage level of the floating diffusion region FD1 to a supply voltage VDD level in response to a reset signal RG1. In response to photo-generated charges transmitted from the floating diffusion region FD1, the drive transistor DX1 outputs an electrical signal proportioned to an amount of the photo-generated charges. The select transistor SX1 outputs an output signal of the drive transistor DX1 to the CDS block 340 in response to a select signal SEL. The first transmission control signal TG1, the second transmission control signal DG, the reset signal RG1 and the select signal SEL are generated by the second row driver 320.

Figure 4:
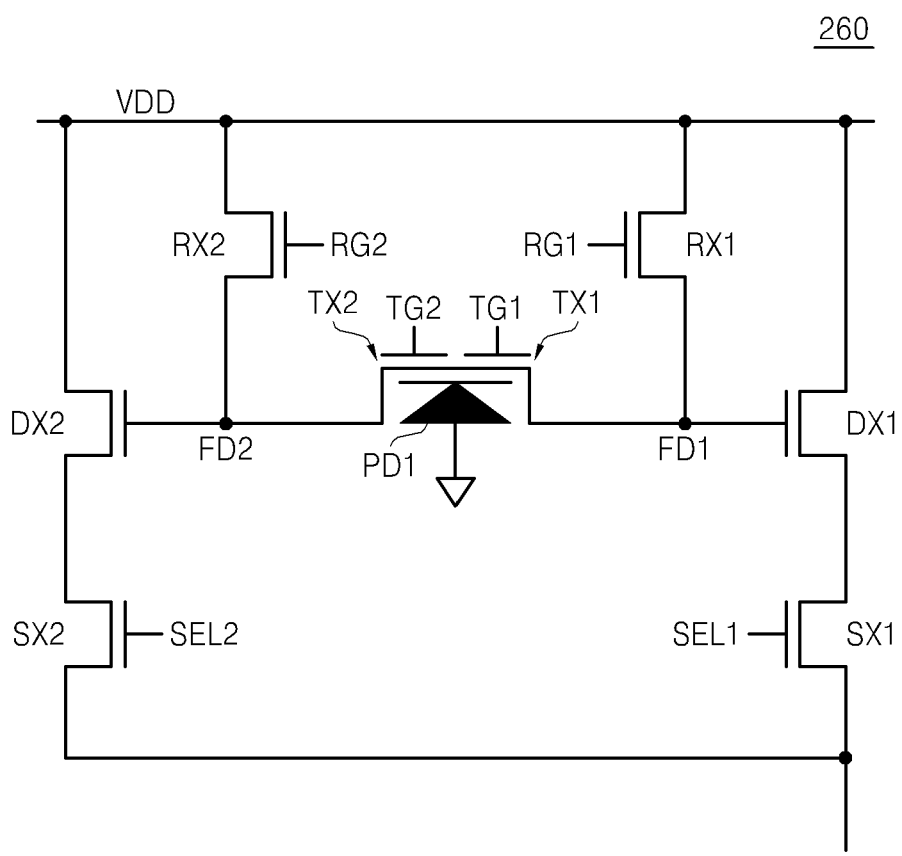
FIG. 4 is a circuit diagram illustrating another depth pixel that may be included in the pixel array of FIG. 1.

FIG. 4 is another circuit diagram a depth pixel 260 that may be included in the pixel array 100 of FIG. 1. Referring to FIGS. 1 to 4, the depth pixel 260 includes the photo-electric conversion element PD1, the first transmission transistor TX1, the second transmission transistor TX2, the first reset transistor RX1, a second reset transistor RX2, the first drive transistor DX1, a second drive transistor DX2, the first select transistor SX1 and a second select transistor SX2.

The photo-electric conversion element PD1 generates photo-generated charges corresponding to an incident light incident to the depth pixel 260. The photo-electric conversion element PD1 may be embodied in a photo diode or a pinned photo diode.

The first transmission transistor TX1 transmits the photo-generated charges accumulated on the photo-electric conversion element PD1 to the first floating diffusion region FD1 in response to the first transmission control signal TG1. The photo-generated charges transmitted by a turn-on operation of the first transmission transistor TX1 are stored in the first floating diffusion region FD1. The first transmission control signal TG1 each having a phase difference of 0° or 90° from an infrared photon signal is supplied successively to a gate of the first transmission transistor TX1.

The second transmission transistor TX2 transmits the photo-generated charges accumulated on the photo-electric conversion element PD1 to a second floating diffusion region FD2 in response to a second transmission control signal TG2. The photo-generated charges transmitted by a turn-on operation of the second transmission transistor TX2 are stored in the second floating diffusion region FD2. The second transmission control signal TG2 each having a phase difference of 180° or 270° from an infrared photon signal is supplied successively to a gate of the second transmission transistor TX2. That is, a phase of the second transmission control signal TG2 has a phase difference of 180° from the first transmission control signal TG1.

The image sensor 10 may be used to determine depth information between the image sensor and an imaged object based on photo-generated charges transmitted to the first floating diffusion region FD1 and the second floating diffusion region FD2. Accordingly, the depth pixel 260 illustrated in FIG. 4 may be understood as a two-tap structure.

The first reset transistor RX1 may reset a voltage level of the first floating diffusion region FD1 to a supply voltage VDD level in response to a first reset signal RG1. The second reset transistor RX2 may reset a voltage level of the second floating diffusion region FD2 to the supply voltage VDD level in response to a second reset signal RG2.

The first drive transistor DX1 outputs an electric signal proportioned to an amount of the photo-generated charges in response to photo-generated charges transmitted from the first floating diffusion region FD1. The second drive transistor DX2 outputs an electric signal proportioned to an amount of the photo-generated charges in response to photo-generated charges transmitted from the second floating diffusion region FD2.

The first select transistor SX1 outputs an output signal of the first drive transistor DX1 to the CDS block 340 in response to a first select signal SEL1. The second select transistor SX2 outputs an output signal of the second drive transistor DX2 to the CDS block 340 in response to a second select signal SEL2. The first transmission control signal TG1, the second transmission control signal TG2, the first reset signal RG1, the second reset signal RG2, the first select signal SEL1 and the second select signal SEL2 are generated by the second row driver 320.

Figure 5:
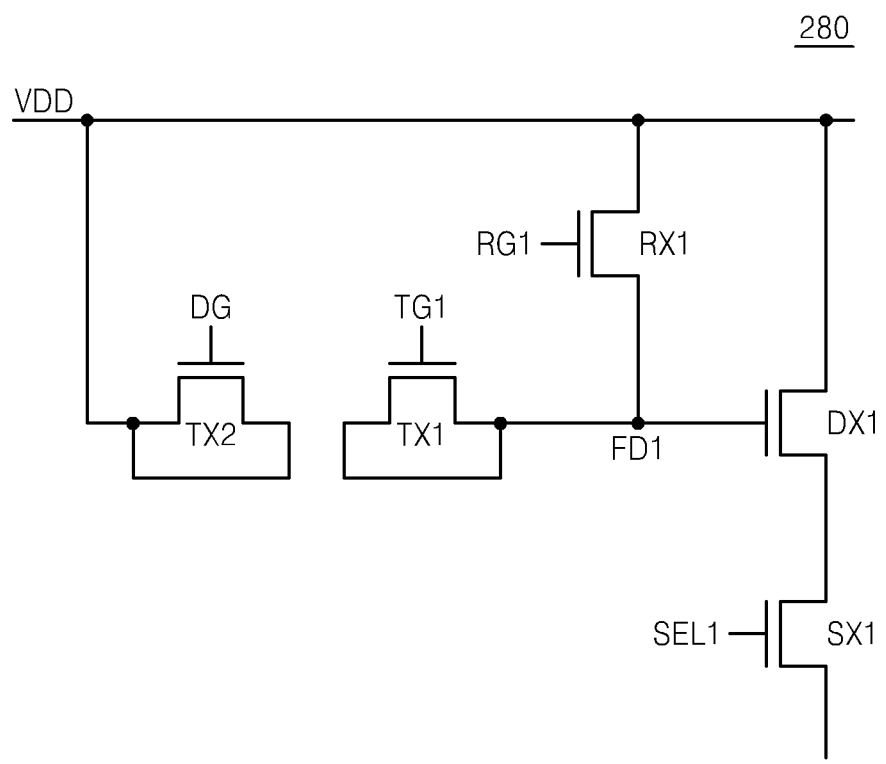
FIG. 5 is a circuit diagram illustrating still another depth pixel that may be included in the pixel array of FIG. 1.

FIG. 5 is still another circuit diagram of a depth pixel 280 that may be included in the pixel array 200 of FIG. 1. Referring to FIGS. 1 and 5, the depth pixel 280 includes the transmission transistor TX1, the overflow transistor TX2, the reset transistor RX1, the drive transistor DX1 and the select transistor SX1.

Each source terminal (or node) and each drain terminal (or node) of the transmission transistor TX1 and the overflow transistor TX2 are connected to each other, respectively. That is, each gate and each body of the transmission transistor TX1 and the overflow transistor TX2 have a floating structure. Accordingly, the depth sensor 280 does not include a photoelectric conversion element like depth pixel 240 illustrated in FIG. 3. Except for this particular difference, the structure and operation of the depth pixel 280 shown in FIG. 5 is substantially similar to that of the depth pixel 240 shown in FIG. 3.

Figure 6:
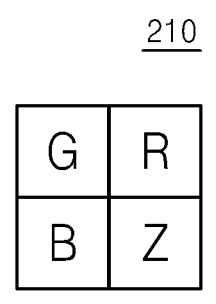
Figure 7:
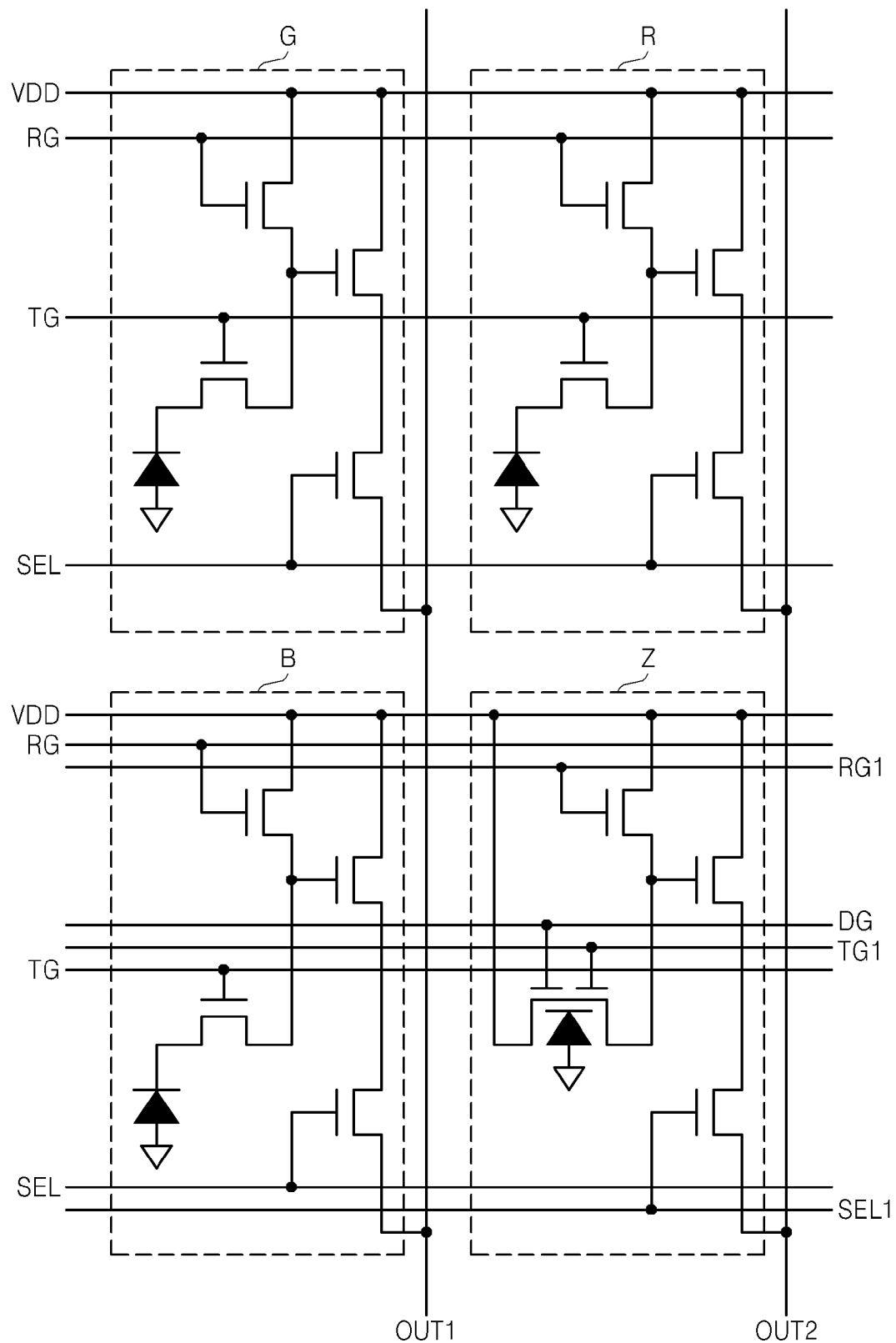
FIG. 7 is a circuit diagram further illustrating in one embodiment the unit pixel of FIG. 6.

FIG. 6 is a conceptual diagram of a unit pixel that may be included in the pixel array 200 of FIG. 1. FIG. 7 is a circuit diagram further illustrating in one embodiment the unit pixel of FIG. 6. Referring to FIGS. 1, 6 and 7, the pixel array 200 is assumed to include a plurality of unit pixels 210. The unit pixel 210 includes a plurality of color pixels R, G and B and a depth pixel Z. That is, the unit pixel 210 includes a red pixel R, a green pixel G, a blue pixel B and a depth pixel Z. According to the illustrated embodiment, the particular arrangement of the plurality of color pixels R, G and B and the depth pixel Z is merely exemplary in nature and may be varied in other embodiments.

The structure and operation of each of the plurality of color pixels R, G and B may be as described above in regard to the color pixel 220 of FIG. 2, whereas the structure and operation of the depth pixel Z may be as above in regard to one or more of the depth pixels 240, 260 and 280 of FIGS. 3, 4 and 5. The respective sizes of the plurality of pixels R, G, B and Z may be the same as suggested by the unit pixel 210 of FIG. 6. However, this need not always be the case.

Each of the plurality of color pixels R, G and B is connected to a power supply line that supplies a supply voltage VDD and a first signal line group. The first signal line group includes a plurality of signal lines for supplying each of a plurality of control signals RG, TG and SEL for controlling each operation of the plurality of color pixels R, G and B.

Each of the plurality of control signals RG, TG and SEL is output from the first row driver 300. That is, the first row driver 300 may supply the plurality of control signals RG, TG and SEL to each of the plurality of color pixels R, G and B through the first signal line group.

The depth pixel Z is connected to the power supply line that supplies a supply voltage VDD and a second signal line group. The second signal line group includes a plurality of signal lines for supplying each of a plurality of control signals RG1, DG, TG1 and SEL1 for controlling an operation of the depth pixel Z.

Each of a plurality of control signals RG1, DG, TG1 and SEL1 is output from the second row driver 320. That is, the second row driver may supply the plurality of control signals RG1, DG, TG1 and SEL1 to the depth pixel Z through the second signal line group.

Pixels, embodied on (or along) the same column among the plurality of pixels R, G, B and Z included in the unit pixel 210, share an output line. That is, each output signal of the green pixel G and the blue pixel B is transmitted to the CDS block 340 through a first output line OUT1. In addition, each output signal of the red pixel R and the depth pixel Z is transmitted to the CDS block 340 through a second output line OUT2. In the end, pixels, embodied on (or along) an identical column among a plurality of pixels included in the pixel array 200, may share an output line.

Figure 8:
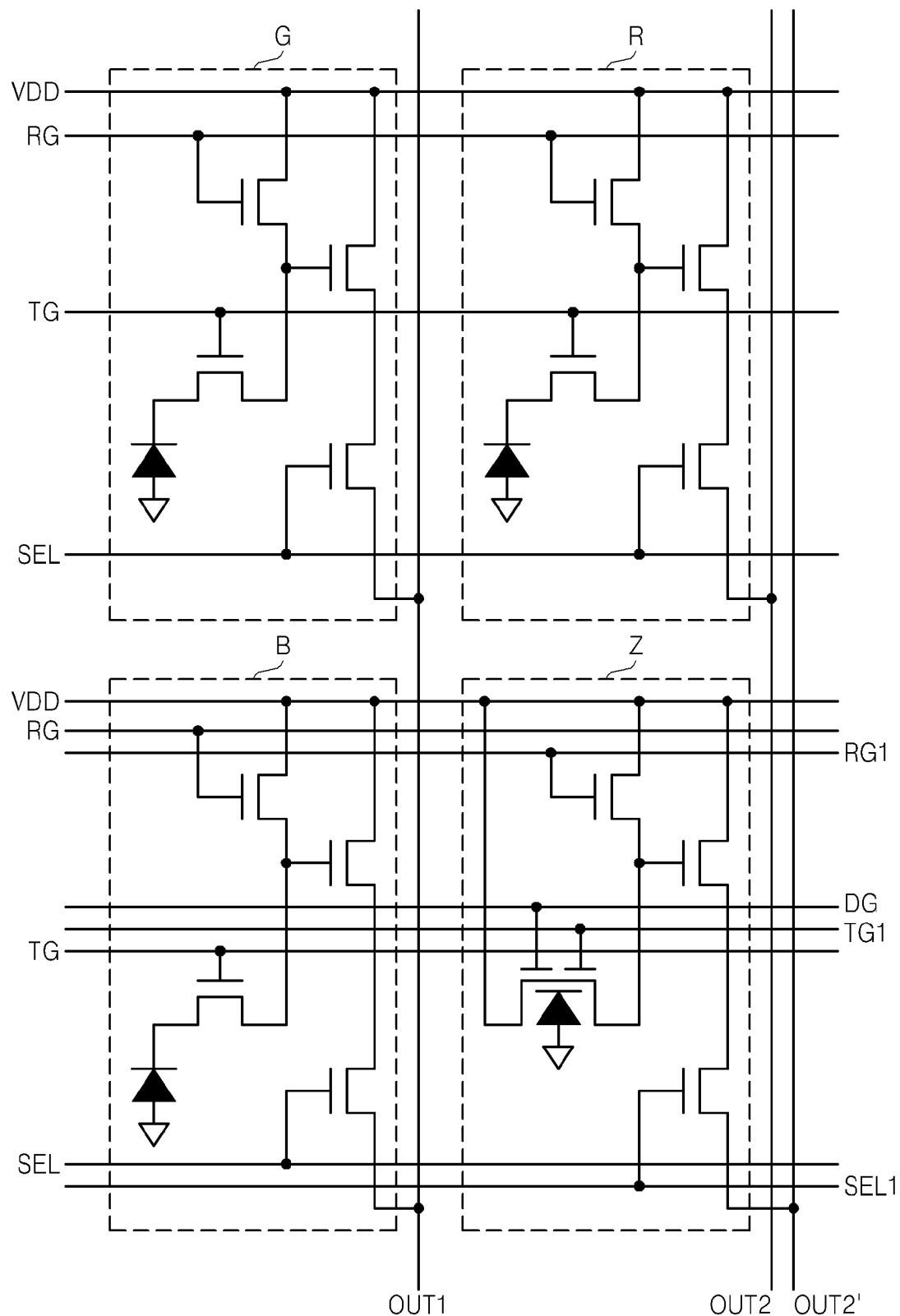
FIG. 8 is a circuit diagram further illustrating in another embodiment the unit pixel of FIG. 6.

FIG. 8 is a circuit diagram further illustrating in another embodiment the unit pixel illustrated in FIG. 6. Referring to FIGS. 1, 6 and 8, the unit pixel 210-1 includes a plurality of color pixels R, G and B and a depth pixel Z. The structure and operation of the unit pixel 210-1 of FIG. 8 may be substantially similar to that of the unit pixel 210 of FIG. 7, except for the following noted differences.

The green pixel G and the blue pixel B share an output line. That is, each output signal of the green pixel G and the blue pixel B is transmitted to the CDS block 340 through a first output line OUT1.

However, the red pixel R and the depth pixel Z do not share an output line. That is, an output signal of the red pixel R is transmitted to the CDS block 340 through a second output line OUT2, and an output signal of the depth pixel Z is transmitted to the CDS block 340 through a third output line OUT2'.

In other words, color pixels that are embodied along the same column among a plurality of color pixels included in the pixel array 200, share an output line. In addition, depth pixels that are embodied along the same column among a plurality of depth pixels included in the pixel array 200, share an output line.

Figure 9:
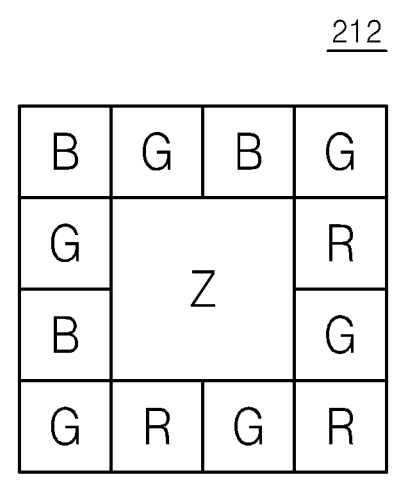
Figure 10:
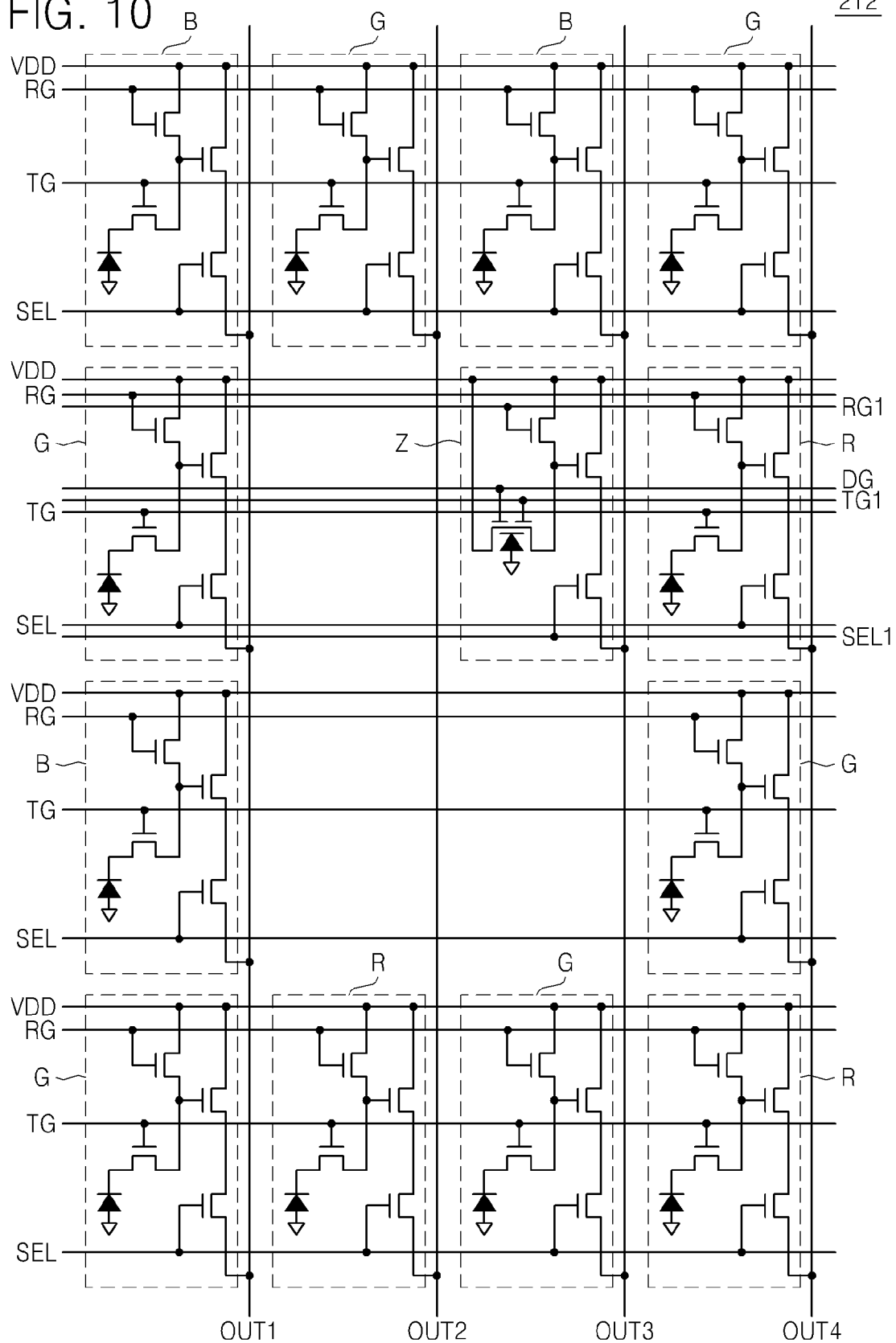
FIG. 10 is a circuit diagram further illustrating in one embodiment the unit pixel of FIG. 9.

FIG. 9 is a conceptual diagram illustrating another unit pixel that may be included in the pixel array 200 of FIG. 1. FIG. 10 is a circuit diagram further illustrating in one embodiment the unit pixel of FIG. 9. Referring to FIGS. 1, 9 and 10, the pixel array 200 may include a plurality of unit pixels 212. The unit pixel 212 includes the plurality of color pixels R, G and B and the depth pixel Z. That is, the unit pixel 212 includes the red pixel R, the green pixel G, the blue pixel B and the depth pixel Z. According to the illustrated embodiment, each of the plurality of color pixels R, G and B and the depth pixel Z may be variably arranged.

The structure and operation of each of the plurality of color pixels R, G and B may be substantially the same as the color pixel 220 of FIG. 2. In addition, the structure and operation of the depth pixel Z may be substantially the same as one of the depth pixels 240, 260 and 280 of FIGS. 3, 4 and 5. Of particular note, the size of the plurality of color pixels R, G and B is less than the size of the depth pixel Z in the unit pixel 212 of FIG. 9.

Each of the plurality of color pixels R, G and B is connected to a power supply line that supplies the supply voltage VDD and a first signal line group. The first signal line group includes a plurality of signal lines for supplying each of the plurality of control signals RG, TG and SEL for controlling each operation of the plurality of color pixels R, G and B.

Each of the plurality of control signals RG, TG and SEL is output from the first row driver 300. That is, the first row driver 300 may supply the plurality of control signals RG, TG and SEL to each of the plurality of color pixels R, G and B through the first signal line group.

The depth pixel Z is connected to the power supply line that supplies the supply voltage VDD and a second signal line group. The second signal line group includes a plurality of signal lines for supplying each of the plurality of control signals RG1, DG, TG1 and SEL1 for controlling an operation of the depth pixel Z.

Each of a plurality of control signals RG1, DG, TG and SEL1 is output from the second row driver 320. That is, the second row driver 320 may supply the plurality of control signals RG1, DG, TG1 and SEL1 to the depth pixel Z through the second signal line group.

Pixels, which are embodied along the same column among the plurality of pixels R, G, B and Z included in the unit pixel 212, share an output line. That is, each output signal of the plurality of pixels R, G, B and Z included in the unit pixel 212 is output through an output line of one of a first output line OUT1, a second output line OUT2, a third output line OUT3 and a fourth output line OUT4. Pixels, which are embodied along the same column among a plurality of pixels included in the pixel array 200, may share an output line.

Figure 11:
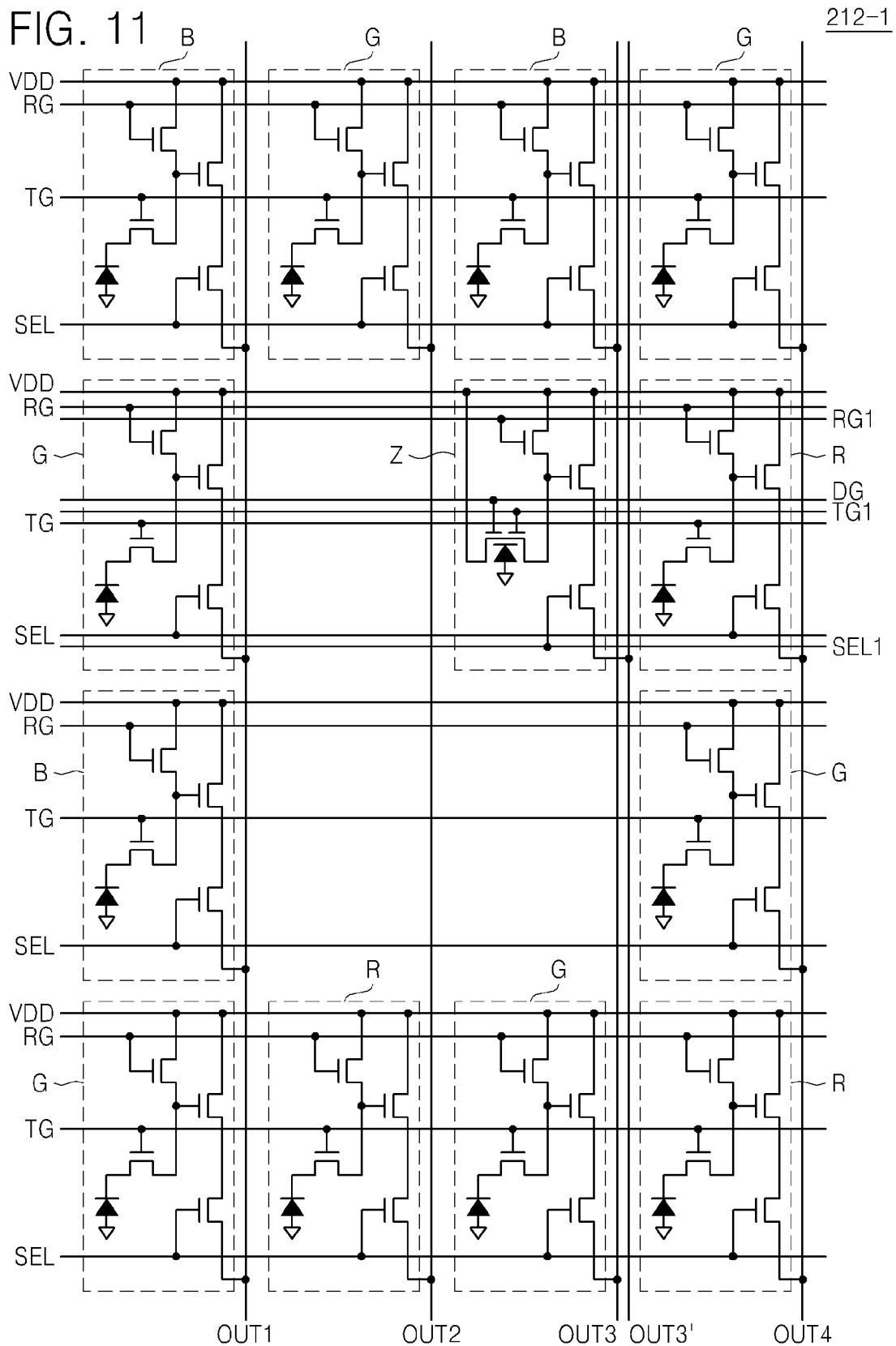
FIG. 11 is a circuit diagram further illustrating in another embodiment the unit pixel of FIG. 9.

FIG. 11 is a circuit diagram further illustrating in another embodiment the unit pixel of FIG. 6. Referring to FIGS. 1, 9 and 11, a unit pixel 212-1 includes the plurality of color pixels R, G and B and the depth pixel Z. The structure and operation of the unit pixel 212-1 illustrated in FIG. 11 may be similar to that of the unit pixel 212 of FIG. 10, except as noted.

For example, each of the plurality of color pixels and the depth pixel Z included in the unit pixel 212-1 do not share an output line. That is, each output signal of the plurality of color pixels R, G and B included in the unit pixel 212-1 is output through an output line of one of the first output line OUT1, the second output line OUT2, the third output line OUT3 and the fourth output line OUT4. An output signal of the depth pixel Z is output through a fifth output line OUT3'.

Figure 12:
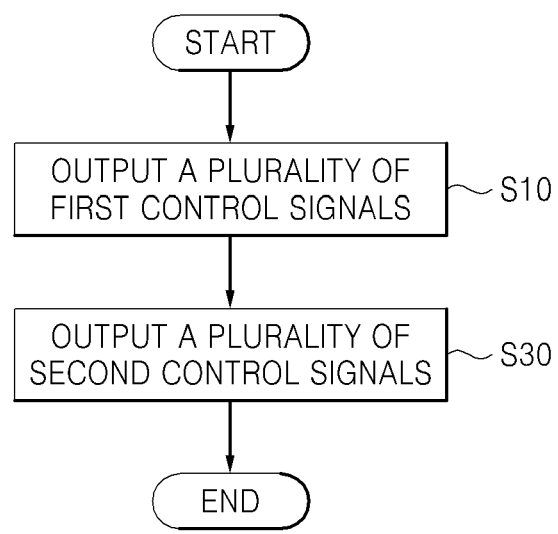
FIG. 12 is a flowchart summarizing one possible operating method of the image sensor of FIG. 1.

FIG. 12 is a flowchart generally summarizing an operating method for the image sensor of FIG. 1. Referring to FIGS. 1 and 12, the first row driver 300 outputs a plurality of first control signals that control the operation of the plurality of color pixels in the pixel array 200 (S10). The first row driver 300 may output the plurality of first control signals under the control of the timing generator 400. Here, the plurality of first control signals is transmitted through the first signal line group. The first signal line group may include a plurality of signal lines that supplies the plurality of first control signals.

The second row driver 320 outputs a plurality of second control signals for controlling the operation of the plurality of color pixels included in the pixel array 200 (S30). The second row driver 320 may output the plurality of second control signals under the control of the timing generator 400. Here, the plurality of second control signals is transmitted through a second signal line group. The first signal line group may include a plurality of signal lines that supply the plurality of first control signals.

Figure 13:
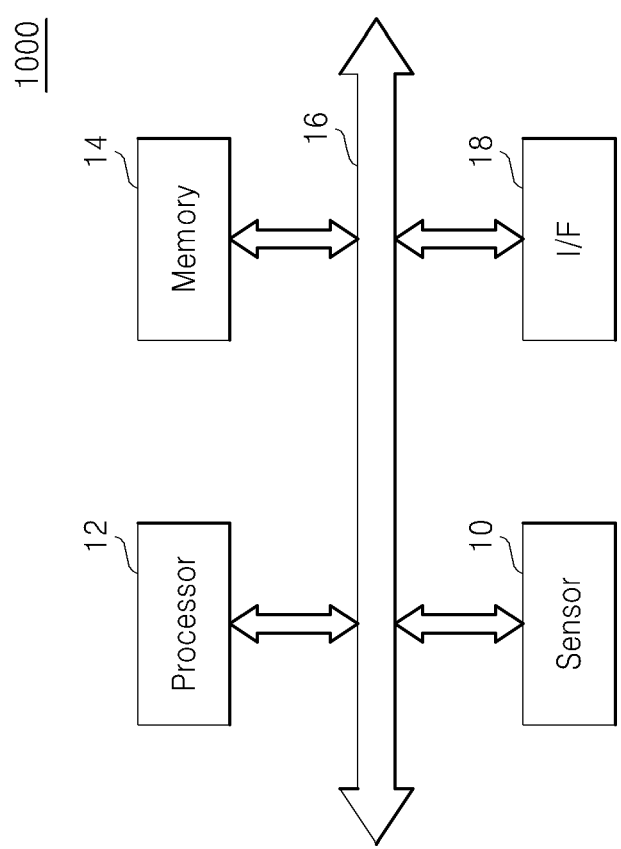
FIG. 13 is a block diagram of a data processing system including the image sensor of FIG. 1.

FIG. 13 is a block diagram of a data processing system including a sensor like the image sensor 10 of FIG. 1. Referring to FIGS. 1 and 13, the data processing system 1000 comprises the sensor 10 and a processor 12. The data processing system 1000 may be embodied in a 3D distance measurer, a game controller, a depth camera, a mobile communication device or a gesture sensing apparatus.

The processor 12 may control an operation of the sensor, e.g., an operation of the timing generator 400, through a bus 16. The processor 12 may store a program for controlling an operation of the sensor 10. According to the illustrated embodiment, the processor 12 may perform the program stored in the memory by accessing a memory (not shown) where a program for controlling an operation of the sensor 10 is stored.

The sensor 10 may generate 3D image information based on each digital pixel signal, e.g., color information or depth information, under the control of the processor 12. The generated 3D image information may be displayed through a display (not shown) connected to an interface 18. That is, an image signal processor 20 included in the sensor 10 or equipped separately may process a signal output from the sensor 10 and display a processed signal through a display.

3D image information generated by the sensor 10 may be stored in a memory device 14 through the bus 16 under the control of the processor 12. The memory device 14 may be embodied in a non-volatile memory device.

The interface 18 may be embodied in an interface for inputting/outputting 3D image information. According to an example embodiment, the interface 18 may be embodied in an input device such as a keyboard, a mouse and a touch pad, or an output device such as a display and a printer.

As described above, certain embodiments of the inventive concept include color pixels such as a red pixel, a green pixel or a blue pixel. However, other embodiments of the inventive concept include color pixels wherein the red pixel is replaced by a cyan pixel, a yellow pixel and a magenta pixel; the green pixel is be replaced by another cyan pixel, yellow pixel and magenta pixel; and/or, the blue pixel is replaced by yet another cyan pixel, yellow pixel and magenta pixel. Here, the cyan pixel is able to convert incident light of a defined cyan spectrum region into a corresponding electrical signal, the yellow pixel is able to convert incident light in a defined yellow spectrum region into a corresponding electrical signal, and the magenta pixel is able to convert light in a defined magenta spectrum region into a corresponding electrical signal.

A sensor, such as an image sensor, according to embodiments of the inventive concept may embody a plurality of color pixels and a plurality of depth pixels in one chip. Additionally, the sensors according to embodiments of the inventive concept may determine color information for an imaged object and depth information for the imaged object.

Although a few embodiments of the present general inventive concept have been shown and described, it will be appreciated by those skilled in the art that changes may be made in these embodiments without departing from the scope of the inventive concept as defined by the appended claims and their equivalents.

What is claimed is:

1. A sensor comprising:
  a pixel array including a unit pixel including a plurality of color pixels with a depth pixel;
  a first signal line group of first signal lines that supply first control signals controlling operation of the plurality of color pixels; and
  a second signal line group of second signal lines that supply second control signals controlling operation of the depth pixel,
  wherein the plurality of color pixels and the depth pixel share an output line.

2. The sensor of claim 1, further comprising:
  a first row driver disposed on one side of the pixel array that generates the first control signals; and a second row driver disposed on an opposing side of the pixel array that generates the second control signals.

3. The sensor of claim 1, wherein a size of each one of the plurality of color pixels is the same as a size of the depth pixel.

4. The sensor of claim 1, wherein a size of at least one of the plurality of color pixels is different from a size of the depth pixel.

5. The sensor of claim 1, wherein a size of at least one of the plurality of color pixels is less than a size of the depth pixel.

6. The sensor of claim 1, wherein the depth pixel is one of a one-tap structure and a two-tap structure.

7. The sensor of claim 1, wherein more than one of the plurality of color pixels transmit output signals through the shared output line.

8. The sensor of claim 1, wherein one of the plurality of color pixels transmits output signals through the shared output line.

9. A data processing system comprising:
an image sensor and a processor that controls operation of the image sensor, wherein the image sensor comprises:
a pixel array including a unit pixel including a plurality of color pixels with a depth pixel;
a first signal line group of first signal lines that supply first control signals controlling operation of the plurality of color pixels; and
a second signal line group of second signal lines that supply second control signals controlling operation of the depth pixel,
wherein the plurality of color pixels and the depth pixel share an output line.

10. The data processing system of claim 9, wherein the sensor further comprises:
a first row driver that generates the first control signals, and
a second row driver that generates the second control signals.

11. The data processing system of claim 9, wherein the data processing system is a gesture sensing apparatus.

12. The data processing system of claim 9, wherein more than one of the plurality of color pixels transmit output signals through the shared output line.

13. The data processing system of claim 9, wherein one of the plurality of color pixels transmits output signals through the shared output line.

14. A mobile communication device comprising:
an image sensor and a processor that controls operation of the image sensor, wherein the image sensor generates a signal output and comprises a pixel array including a unit pixel including a plurality of color pixels with a depth pixel, a first signal line group of first signal lines that supply first control signals controlling operation of the plurality of color pixels, and a second signal line group of second signal lines that supply second control signals controlling operation of the depth pixel; and
an image signal processor that processes the signal output to display a processed signal via a display,
wherein the plurality of color pixels and the depth pixel share an output line.

15. The mobile communication device of claim 14, wherein the sensor further comprises:
a first row driver that generates the first control signals, and
a second row driver that generates the second control signals.

16. The mobile communication device of claim 14, wherein more than one of the plurality of color pixels transmit output signals through the shared output line.

17. The mobile communication device of claim 14, wherein one of the plurality of color pixels transmits output signals through the shared output line.

* * * * *